US010012702B2

(12) United States Patent
Hirschbold et al.

(10) Patent No.: US 10,012,702 B2
(45) Date of Patent: Jul. 3, 2018

(54) MULTI-PHASE POWER METER CONFIGURED FOR MONITORING GENERATOR BATTERY VOLTAGE

(71) Applicant: SCHNEIDER ELECTRIC USA, INC., Palatine, IL (US)

(72) Inventors: Markus F. Hirschbold, Victoria (CA); Daniel Neil Loewen, Sidney (CA)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 241 days.

(21) Appl. No.: 14/652,197

(22) PCT Filed: Dec. 19, 2012

(86) PCT No.: PCT/US2012/070570
§ 371 (c)(1),
(2) Date: Jun. 15, 2015

(87) PCT Pub. No.: WO2014/098835
PCT Pub. Date: Jun. 26, 2014

(65) Prior Publication Data
US 2015/0331061 A1    Nov. 19, 2015

(51) Int. Cl.
H02J 7/00 (2006.01)
G01M 17/00 (2006.01)
G01R 31/36 (2006.01)
(52) U.S. Cl.
CPC ....... G01R 31/3679 (2013.01); G01R 31/362 (2013.01); G01R 31/3651 (2013.01)
(58) Field of Classification Search
CPC .................................................. G01R 31/3693
USPC .... 701/32.1, 32.9, 33.4, 33.7–34.1, 99, 101, 701/113; 320/134, 136
See application file for complete search history.

(56) References Cited

U.S. PATENT DOCUMENTS

| 6,118,252 | A | 9/2000 | Richter |
| 6,424,157 | B1* | 7/2002 | Gollomp ............. G01R 31/006 320/132 |
| 6,472,875 | B1 | 10/2002 | Meyer |
| 7,218,118 | B1* | 5/2007 | Gonring ............. G01R 31/3693 320/128 |

(Continued)

FOREIGN PATENT DOCUMENTS

| DE | 3901680 A1 | 3/1990 |
| WO | 2012066064 A2 | 5/2012 |

OTHER PUBLICATIONS

"StruxureWare(TM) Power Monitoring(TM) 7.0, EPSS Test Solution, Emergency Power Supply System, Installation and Configuration Guide", 7EN42-0070-02, Schneider Electric, May 2012, pp. 1-138.

(Continued)

Primary Examiner — Richard V Muralidar
(74) Attorney, Agent, or Firm — Lando & Anastasi, LLP

(57) ABSTRACT

Disclosed herein are embodiments of systems and methods for determining the state of health of a generator battery set and its ability to supply generator starter motor with start-up energy by capturing a profile of voltage across terminals of the battery during a supply of electrical energy from the battery to the starter and comparing the captured voltage profile to a reference voltage profile to determine if a difference between the captured voltage profile and reference voltage profile exceeds an acceptable amount.

18 Claims, 9 Drawing Sheets

(56) References Cited

U.S. PATENT DOCUMENTS

| | | | |
|---|---|---|---|
| 8,244,449 B2* | 8/2012 | Mizuno | G01R 31/3662 |
| | | | 123/179.4 |
| 8,770,165 B2* | 7/2014 | Mizuno | F02D 29/06 |
| | | | 123/179.3 |
| 8,972,213 B2* | 3/2015 | Zhang | G01R 31/3679 |
| | | | 702/58 |
| 9,784,798 B2* | 10/2017 | Hirschbold | G01R 31/3693 |
| 2002/0113593 A1 | 8/2002 | Meissner et al. | |
| 2004/0080406 A1 | 4/2004 | Huang | |
| 2004/0124990 A1 | 7/2004 | Zur et al. | |
| 2007/0254193 A1 | 11/2007 | Lam | |
| 2009/0146664 A1 | 6/2009 | Zhang | |
| 2009/0192700 A1* | 7/2009 | Votoupal | F02N 11/10 |
| | | | 701/113 |
| 2009/0322340 A1 | 12/2009 | Zhang et al. | |
| 2011/0199117 A1 | 8/2011 | Hutchings et al. | |
| 2011/0291621 A1 | 12/2011 | Iles et al. | |
| 2014/0028116 A1* | 1/2014 | O'Brien | H02H 3/02 |
| | | | 307/130 |
| 2016/0003919 A1* | 1/2016 | Hirschbold | G01R 31/362 |
| | | | 324/433 |

OTHER PUBLICATIONS

Supplementary European Search Report from corresponding European Application No. 12890456.2 dated Sep. 8, 2016.
International Search Report from corresponding PCT/US2012/070570 dated Feb. 22, 2013.

* cited by examiner

MULTI-PHASE POWER METER CONFIGURED FOR MONITORING GENERATOR BATTERY VOLTAGE

BACKGROUND

Internal combustion electrical backup generators (referred to also herein as simply "generators") used at critical facilities depend on healthy batteries to provide the energy required during start-up. Battery testing is often included as part of regular generator maintenance and testing, and such testing often falls into state-of-charge (SOC) and state-of-health (SOH) categories. SOH testing methods may require manual labor (such as chemical tests of cell electrolyte samples) or simple electrical measurements that can generate false alarms, or fail to provide notification of pending failure (such as basic set points on the minimum voltage during generator start-up). More advanced electrical measurements for tracking battery SOH may involve voltage and current measurements, but may require expensive DC current transducers.

Aspects and embodiments of the present disclosure are directed generally to methods and apparatus for determining the health of a battery utilized for starting an internal combustion backup electrical generator.

SUMMARY

In accordance with an aspect of the present disclosure, there is provided a system for determining the state of health of a generator battery and the ability of the battery to supply a generator starter motor with start-up energy. The system comprises a generator having a starter motor and electrical outputs, a battery electrically coupled to the starter motor of the generator, and a monitoring system including an electrical meter electrically coupled to the electrical outputs of the generator and to the battery, the monitoring system being configured to monitor electrical characteristics of power supplied from the electrical outputs of the generator, capture a profile of voltage across terminals of the battery during a supply of electrical energy from the battery to the starter motor, and compare the captured voltage profile to a reference voltage profile and determine if a difference between the captured voltage profile and reference voltage profile exceeds an acceptable amount.

In accordance with some embodiments, the system further includes an output configured to issue a warning responsive to the difference between the captured voltage profile and the reference voltage profile exceeding the acceptable amount.

In accordance with some embodiments, the monitoring system further includes a controller configured to provide a signal to the generator to start and to provide a signal to the electrical meter to begin measuring the voltage profile.

In accordance with some embodiments, the controller is further configured to cause the electrical meter to begin to capture the voltage profile with a pre-trigger capture delay prior to the beginning of a generator starting operation.

In accordance with some embodiments, the controller is further configured to generate a visual representation of the captured voltage profile compared to the reference voltage profile.

In accordance with some embodiments, the monitoring system is configured to generate the reference voltage profile from a previously captured battery voltage profile.

In accordance with some embodiments, the monitoring system is configured to generate the reference voltage profile from an aggregation of a plurality of previously captured battery voltage profiles.

In accordance with some embodiments, the monitoring system is configured to generate the reference voltage profile from an aggregation of a plurality of previously captured battery voltage profiles captured from over a moving window of time during which a predefined number of generator start operations were performed In accordance with some embodiments, the monitoring system is configured to define one or more regions of the reference voltage profile, each of the one or more regions having a duration and a magnitude of voltage change.

In accordance with some embodiments, the monitoring system is configured to build a mathematical model describing the reference voltage profile in the one or more regions and issue a warning responsive to the captured battery voltage profile differing from the mathematical model in corresponding one or more of the one or more regions by more than a predetermined amount.

In accordance with some embodiments, the monitoring system is configured to compare one of a duration and a voltage change magnitude of at least one region of the captured voltage profile to that of a corresponding at least one region of the reference voltage profile and issue a warning responsive to a difference between the one of the duration and the voltage change magnitude of the at least one region of the captured voltage profile and that of a corresponding region of the reference voltage profile exceeding a redefined amount.

In accordance with some embodiments, the monitoring system is further configured to generate one or more mathematical equations describing the voltage profile in the one or more regions, define statistical process control limits about the one or more mathematical equations, and issue a warning responsive to data points in the captured battery profile violating a statistical process control rule relative to the statistical process control limits In accordance with another aspect of the present disclosure, there is provided a method of determining the state of health of a generator battery and the ability of the battery to supply a generator starter motor with start-up energy. The method comprises building a reference voltage profile for generator starts, monitoring characteristics of electrical power supplied by electrical outlets of the generator with an electrical meter, capturing a battery voltage profile during a generator start operation with the electrical meter, comparing the captured battery voltage profile to the reference voltage profile, and issuing a warning responsive to one or more parameters of the captured battery profile differing from one or more parameters of the reference voltage profile by more than a predetermined amount.

In accordance with some embodiments, issuing the warning comprises issuing the warning responsive to a cumulative sum of values of differences between a plurality of measurements of the voltage of the captured battery profile and the voltage of the reference voltage profile at corresponding periods of time exceeding a predefined limit.

In accordance with some embodiments, building the reference voltage profile for generator starts comprises defining one or more regions of the reference voltage profile, each of the one or more regions having a duration and a magnitude of voltage change and wherein capturing the battery voltage profile comprises defining one or more regions in the captured battery voltage profile corresponding to the one or more regions defined in the reference voltage profile.

In accordance with some embodiments, issuing the warning comprises issuing the warning responsive to a standard deviation of a plurality of measurements of the voltage in one or more of the regions of the captured battery voltage profile exceeding a standard deviation of voltage in the reference voltage profile in corresponding one or more regions by more than a predefined amount.

In accordance with some embodiments, issuing the warning comprises issuing the warning responsive to one or more parameters of at least two of the regions of the captured voltage profile differing from one or more parameters of corresponding regions of the reference voltage profile by more than predetermined amounts.

In accordance with some embodiments, issuing the warning comprises issuing the warning responsive to one or more parameters of a region of the captured voltage profile differing from one or more parameters of a corresponding region of the reference voltage profile by more than predetermined amount for more than a predetermined amount of time.

In accordance with some embodiments, the method further comprises generating a plurality of reference voltage profiles corresponding to different levels of an environmental factor and comparing the captured voltage profile to a reference voltage profile selected from the plurality of voltage reference profiles responsive to a level of the environmental factor.

In accordance with some embodiments, the method further comprises monitoring a steady-state voltage profile of the battery during a time other than during the generator start operation and issuing a warning responsive to the monitored steady-state voltage profile differing from a reference steady-state voltage profile by greater than a predefined amount.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
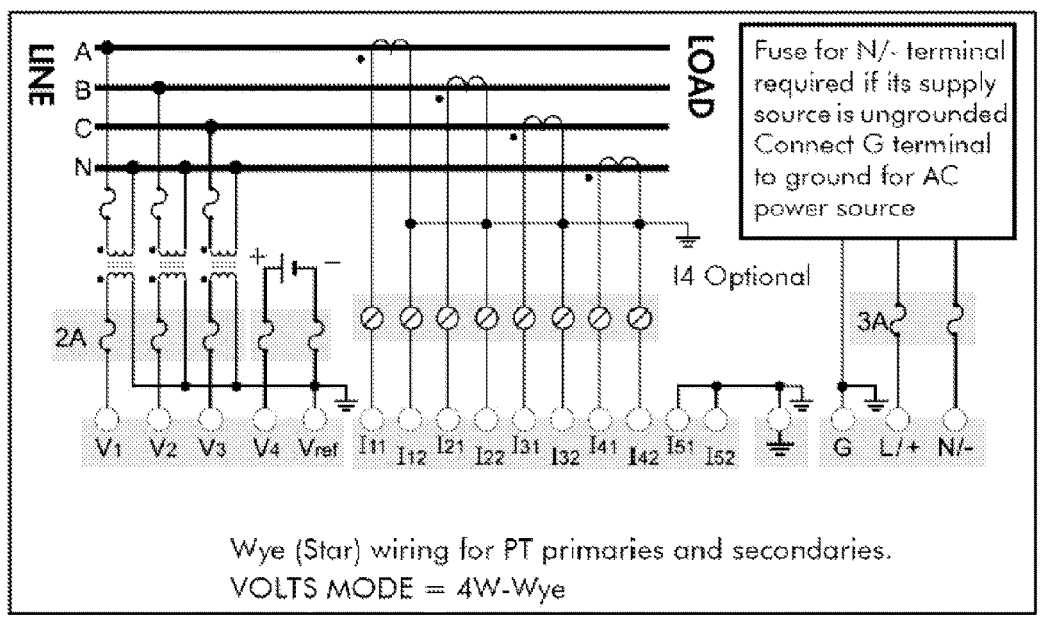
FIG. 1 is an illustration of an arrangement of input terminals of a power meter in accordance with an embodiment of the disclosure.

This disclosure is not limited in its application to the details of construction and the arrangement of components set forth in the following description or illustrated in the drawings. The methods and apparatus disclosed herein are capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

Aspects and embodiments of the present disclosure include a method of determining the SOH of a generator battery or battery assembly (referred to herein as simply a "battery") and its ability to supply start-up energy to a generator by capturing the battery voltage profile during generator start-up and tracking the voltage profile over time. A battery assembly may be comprised of more than one battery unit to generate the DC voltage and current required by a starter motor to start the generator.

Aspects of a battery voltage profile during generator start-up, such as the shape of the profile, magnitude of a change in voltage during start-up, and/or the length of time required to start the generator may each change as the battery SOH deteriorates. A variety of techniques may be used to filter out subtle variations between battery voltage profiles for different generator starts and highlight variations that indicate a pending battery failure before it occurs. Embodiments of the method and of systems implementing embodiments of the method may be utilized to determine the SOH of the battery by measurement of the battery voltage profile only, without the need to measure other parameters, for example, current provided from the battery during operations such as the start of a generator or current delivered to the battery during operations such as battery charging.

FIG. 1 shows the terminals of a digital power meter for receiving signals, for example, voltage and/or current readings, from the three-phase output of a generator as well as terminals for receiving a signal, for example a voltage measurement, from the generator battery. Digital power meters that may be used in various embodiments of the present disclosure include, for example, a PowerLogic® ION7650/7550 power and energy meter (Schneider Electric, Victoria, BC). Generators that may be used in various embodiments of the present disclosure include, for example, a CAT® 3512B diesel generator (Caterpillar Inc., Peoria, Ill.).

In FIG. 1, terminals $V_1$, $V_2$, and $V_3$ are used to monitor the voltage of each of the three phase outputs of the generator, labeled lines A, B, and C, respectively, relative to the neutral line N. $V_{ref}$ is electrically connected to ground. Terminals $I_{11}$ and $I_{12}$ are used to monitor the current through generator output line A. Terminals $I_{21}$ and $I_{22}$ are used to monitor the current through generator output line B. Terminals $I_{31}$ and $I_{32}$ are used to monitor the current through generator output line C. Terminals $I_{41}$ and $I_{42}$ are used to monitor current through generator neutral line N. Terminal $I_4$ is a ground connection. Connecting $I_{41}$ and $I_{42}$ to terminal $I_4$ is optional. Terminals $I_{51}$ and $I_{52}$ are spare current monitor inputs which are typically connected to ground unless needed. Terminals G, L/+ and N/− are ground, line, and neutral connections for a power supply to the power meter.

Terminal $V_4$ is typically not utilized in digital power meters, for example, a PowerLogic® ION7650/7550 power and energy meter to monitor the performance of generators. Terminal $V_4$ is typically coupled to ground and reserved for use as a spare input if needed. In other instances $V_4$ is utilized to measure a neutral line N to ground potential of the generator.

In some embodiments of the present disclosure terminal $V_4$ may be used to monitor the voltage of a battery used to provide power to a starter motor to start the generator. The digital power meter may monitor and record the voltage across terminals of the battery during a generator starting operation to assess the health of the battery and/or generator and/or battery/generator system including the generator, battery, starter motor, and other ancillary components. In some embodiments, the power meter is triggered to begin capturing voltage data through terminal $V_4$ just as the generator initiates a cranking start, with an optional pre-trigger capture delay of between, for example, about 10 milliseconds and about 100 milliseconds used to ensure the complete battery voltage profile during generator start is captured. The power meter may capture battery voltage measurements at a frequency of between about 1,000 Hz (one sample per millisecond) and about 10 Hz (one sample per 100 milliseconds) to create a waveform representing the battery voltage over time. In some embodiments, the power meter constantly runs the high speed voltage capture through a circular buffer. If an event occurs (such as the trigger through the start contact), this buffer is committed to memory. In some embodiments, the buffer holds a finite amount of data, for example, about 1.5 seconds of data, and multiple buffer cycles may be captured to create back-to-back waveform captures for an event having a duration longer than this. The back-to-back waveform captures may be assembled and scaled to produce the complete battery voltage profile over the entire generator start operation. The voltage profile may be stored in memory in the power meter or external to the power meter and compared by the power meter or by an external controller coupled to the power meter to a reference profile also stored in memory either external or internal to the power meter to determine the state of health of the battery and/or generator and/or battery/generator system and produce an output for an operator as described below. The use of the spare terminal $V_4$ on an existing power meter for a generator may eliminate the need to supply a separate voltage monitoring system for the generator system. Further, existing digital power meters on existing generators may be modified, for example, reprogrammed, to perform the methods as described herein without the need for the purchase of additional high cost components.

Figure 4:
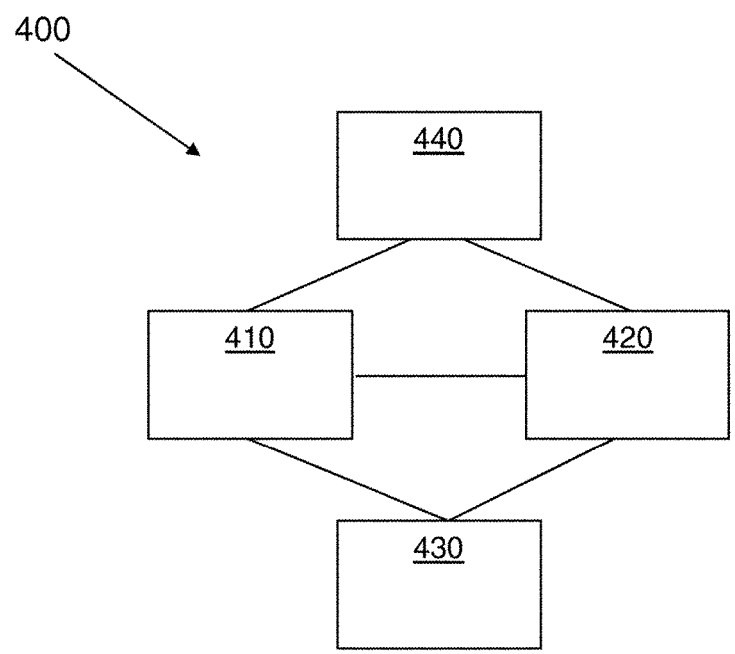
FIG. 4 is a schematic illustration of a system in accordance with an embodiment of the disclosure.

As illustrated in FIG. 4, a system, indicated generally at 400, may include a digital power meter 410 as described above and electrically coupled to both a generator 420 and a starter battery 430 for the generator. The digital power meter may monitor electrical parameters, for example, output voltage and/or current from one or more power output lines of the generator 420 as well as voltage across terminals of the battery 430. A controller 440 may also be present and may be electrically coupled to one or both of the digital power meter 410 and the generator 420. The controller 440 may provide signals to the generator to start and/or stop. The controller 440 may also provide a signal to the digital power meter to begin measuring and/or recording readings of the voltage across the terminals of the battery 430 during, for example, startup of the generator. The controller 440 may provide a signal to the digital power meter to begin measuring and/or recording readings of the voltage across the terminals of the battery 430 prior to startup of the generator and/or subsequent to the startup of the generator. The controller 440 may provide a signal to the digital power meter to measure and/or record readings of the voltage across the terminals of the battery 430 during the charging of the battery.

In different embodiments, controller 440 may be embodied in any of numerous forms. In one example, a computerized controller of embodiments of the system disclosed herein is implemented using one or more computer systems. The computer system(s) may include, for example, a general-purpose computer such as one based on an Intel PENTIUM® or Core™ processor, a Motorola PowerPC® processor, a Sun UltraSPARC® processor, a Hewlett-Packard PA-RISC® processor, or any other type of processor or combinations thereof. Alternatively, the computer system may include specially-programmed, special-purpose hardware, for example, an application-specific integrated circuit (ASIC) or controllers intended specifically for power generation equipment.

The computer system can include one or more processors typically connected to one or more memory devices, which can comprise, for example, any one or more of a disk drive memory, a flash memory device, a RAM memory device, or other device for storing data. The memory device(s) is/are typically used for storing programs and data during operation of the controller and/or computer system. For example, the memory may be used for storing historical data relating to measured electrical parameters of the generator 420 and/or battery 430 over a period of time, reference battery voltage profile(s), as well as current electrical parameter measurement data. Software, including programming code that implements embodiments of the disclosure, can be stored on a computer readable and/or writeable nonvolatile recording medium, and then copied into memory wherein it can then be executed by a processor. Such programming code may be written in any of a plurality of programming languages, for example, Java, Visual Basic, C, C#, or C++, Fortran, Pascal, Eiffel, Basic, COBAL, or any of a variety of combinations thereof.

Components of the computer system may be coupled by an interconnection mechanism, which may include one or more busses (e.g., between components that are integrated within a same device) and/or a network (e.g., between components that reside on separate discrete devices). The interconnection mechanism typically enables communications (e.g., data, instructions) to be exchanged between components of the system.

The computer system can also include one or more input devices, for example, a keyboard, mouse, trackball, microphone, touch screen, and one or more output devices, for example, a printing device, display screen, or speaker. The computer system may be linked, electronically or otherwise, to any one or more of the generator 420, electrical meter 410, and/or battery 430. In addition, the computer system may contain one or more interfaces (not shown) that can connect the computer system to a communication network (in addition or as an alternative to the network that may be formed by one or more of the components of system). This communications network, in some embodiments, forms a portion of a process control system for a facility including the generator 420.

According to one or more embodiments, the one or more output devices are coupled to another computer system or component so as to communicate with the computer system over a communication network. Such a configuration permits one electrical meter/generator system to be located at a significant distance from another electrical meter/generator system or allow any electrical meter/generator system to be located at a significant distance from any subsystem and/or the controller, while still providing data therebetween.

Although the computer system described above is one type of computer system upon which various aspects of the disclosure may be practiced, it should be appreciated that the disclosure is not limited to being implemented in software, or on a computer system as described above. Indeed, rather than implemented on, for example, a general purpose computer system, the controller 440, or components or subsections thereof, may alternatively be implemented as a dedicated system or as a dedicated programmable logic controller (PLC) or in a distributed control system. Further, it should be appreciated that one or more features or aspects of the control system may be implemented in software, hardware or firmware, or any combination thereof. For example, one or more segments of an algorithm executable on the computer system can be performed in separate computers, which in turn, can be in communication through one or more networks.

Figure 2A:
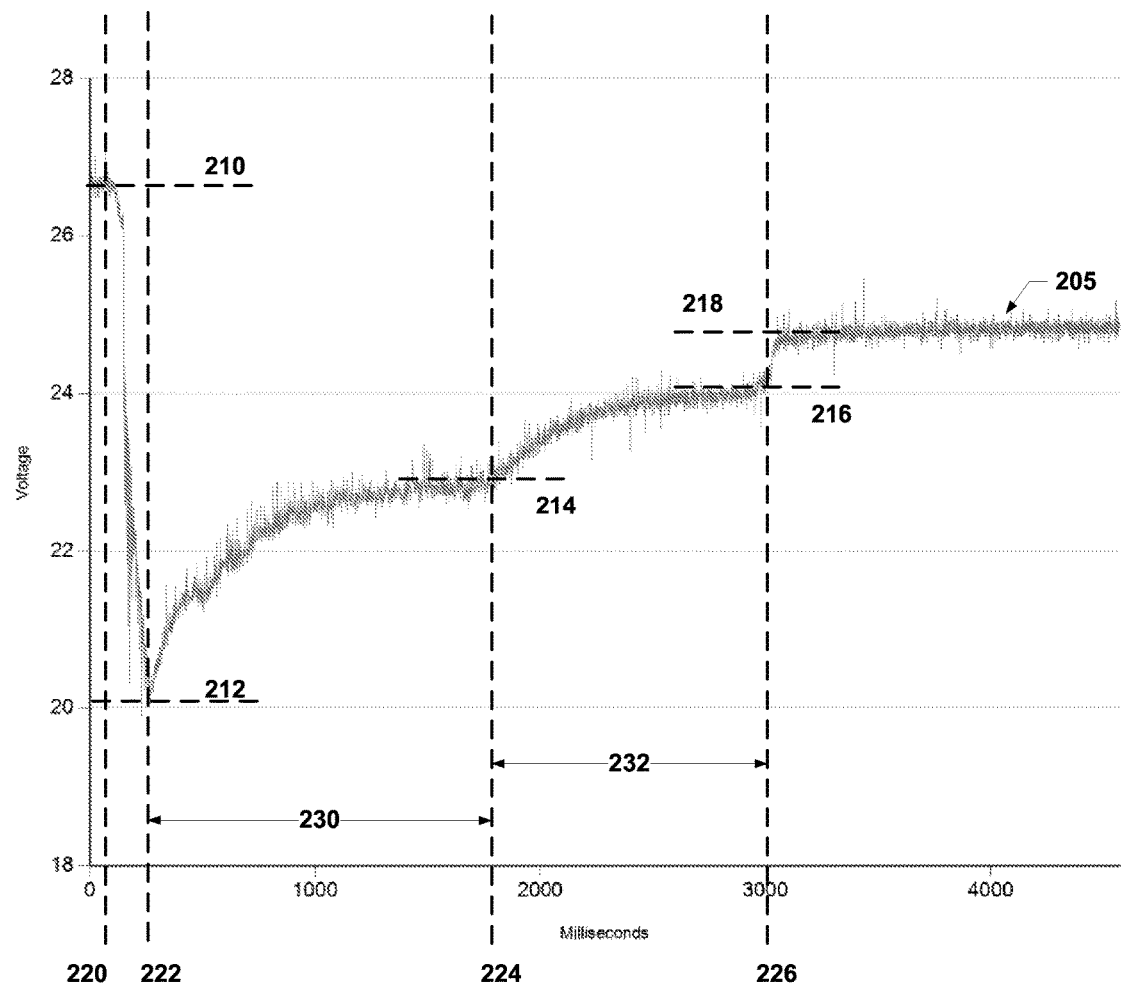
FIG. 2A is an example of a battery voltage profile during the start of a generator.

FIG. 2A shows a sample battery voltage profile during the start of a first generator. High-speed measurements of the battery voltage are plotted as line 205, with the generator starting between time 220 and 226. At time 220, the starter motor is engaged, and the battery voltage drops from level 210 to a minimum voltage level 212 at time 222. As the starter motor turns over the generator, the battery voltage profile shape changes in several distinct stages. Over time durations 230 and 232, the battery voltage level rises and asymptotically approaches voltage levels 214 and 216, respectively. The regions of the voltage profile over durations 230 and 232 are similar in shape, but vary in the magnitude of voltage change over the regions and the duration of the regions. The region including duration 230 may, for example, represent the starter motor cranking the generator over and the region including duration 232 may represent the generator beginning to start up and the starter motor disengaging after the generator is running on its own. Without being limited to any particular theory, the voltage across the terminals of the battery may increase during time period 230 as the starter motor begins to turn and generates a back EMF fed back to the battery. During the time period 232 the voltage across the terminals may increase due to the generator beginning to run on its own and the starter motor disengaging from the generator. At time 226 the battery voltage profile quickly rises from voltage level 216, which may represent the starter being disengaged and an alternator operated by the generator beginning to recharge the battery, to stable level 218, which increases slowly over time as the battery is recharged.

The battery voltage profile features illustrated in FIG. 2A can be used to build a reference voltage profile for generator starts, and future battery voltage profiles captured during generator starts can be compared against this reference voltage profile to determine if there has been a deterioration in the performance of the battery and/or generator starter motor and/or generator and/or associated ancillary equipment. In one implementation, regions of the reference voltage profile are described in terms of the magnitude of voltage change and duration, with each region representing a different stage of the generator start. Each region may be defined in terms of absolute magnitude of voltage change and duration, or as some percentage of the maximum magnitude of voltage change and duration of a battery voltage profile. The reference voltage profile may be defined in advance using predetermined values of magnitude and duration, or the magnitude and duration values may be determined from an aggregation of multiple battery voltage profile captures from known good systems of batteries, starter motors, and generators. The set of battery voltage profiles aggregated to determine the reference voltage profile may be captured once during some reference period of time, or the set of battery voltage profiles may be captured over a moving window of time in the recent past. The moving window of time may be a window during which a predefined number of generator start operations, for example, about 5, about 8, or about 16 generator start operations are performed.

By way of example, consider a reference voltage profile based on the battery voltage profile shown in FIG. 2A. This reference profile may be comprised of three regions, with each region designed to match the three regions shown for battery voltage profile 205: (a) a first region that includes the maximum voltage drop between times 220 and 222, referred to herein a the "engagement region"; (b) a second region over duration 230, referred to herein as the "cranking region"; and (c) a third region over duration 232, referred to as the "generator starting region." As noted above, each region may be defined in terms of absolute magnitude of voltage change and duration—region (a), for example, may be defined as having a magnitude of voltage change of voltage level 210—voltage level 212 and a duration of time 222—time 220. Alternately, each of the magnitude of voltage change and duration of each region may be defined as a percentage of the maximum magnitude of voltage change and duration of a selected battery voltage profile. Region (b), for example, could be defined to have a magnitude of voltage change of X% of voltage level 210—voltage level 212 and a duration of Y% of time 226—time 220 of battery voltage profile 205.

In another implementation, one or more mathematical models are used to represent the reference voltage profile. Assuming FIG. 2A shows a typical battery voltage profile for a particular generator, a reference voltage profile designed to match battery voltage profile 205 may be comprised of several models, with each model matching a region of profile 205. This composite model may be defined directly based on one or more generator parameters, or the composite model may be based on data acquired from one or more battery voltage profile captures. Different model types and parameters may be used for each region to best represent the reference voltage profile. The rapid drop in battery voltage between times 220 and 222, for example, may be represented by a straight line equation. The parameters of the straight line equation may be obtained by applying linear regression techniques on a number of past battery voltage profiles captured during generator start using a known good battery and known good generator. This equation may have a form of $V=At+V_0$, where V is the observed voltage, t is the time since the beginning of the generator start, for example, from time 220, A represents the slope of the line and may be a negative number, and $V_0$ represents the voltage at the intercept of the line with the voltage axis at time 220. The reference voltage profile over duration 230, for example, may be represented by some portion of a second or third order polynomial equation. This equation may have a form of $V=At^3+Bt^2+Ct+V_0$, where V is the observed voltage, t is the time since the beginning of the generator start, for example, from time 220, A, B, and C are numerical constants, and $V_0$ represents the voltage at the intercept of the line with the voltage axis at time 220. The parameters of the second or third order polynomial equation may be obtained by applying least-squares curve-fitting techniques to a number of past battery voltage profiles captured during generator start using a known good battery and known good generator.

Figure 2B:
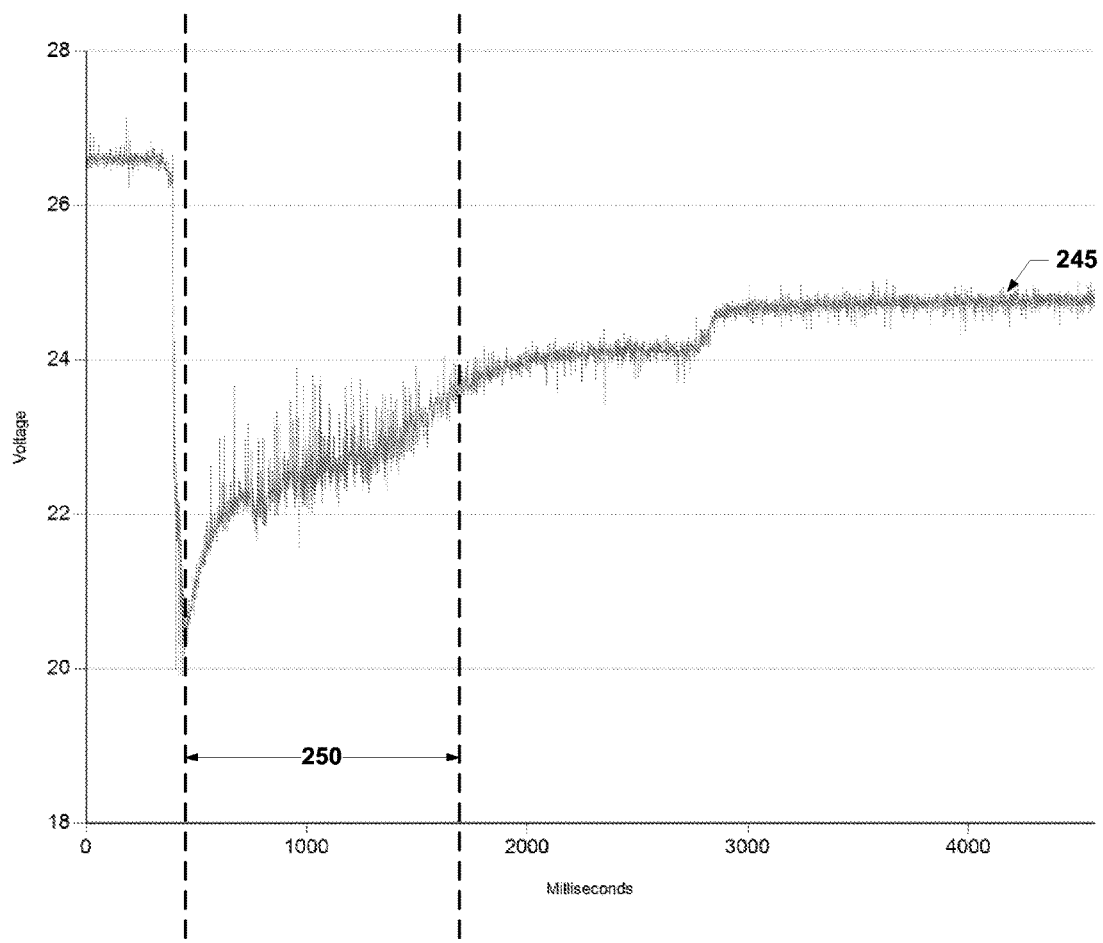
FIG. 2B is an example of a second battery voltage profile during the start of a generator.

FIG. 2B shows a slightly different battery voltage profile during the start of a second generator. The battery voltage profile (plotted as line 245) contains several features in common with battery voltage profile 205, but it also includes a greater magnitude of high-frequency voltage variation over time duration 250. This high-frequency voltage variation may represent an imperfect electrical connection in the components involved in starting the generator. As an example, this voltage variation may reflect an imperfect connection of the brushes in the starter motor. A reference voltage profile describing the overall shape of an expected battery voltage profile during generator start may be augmented to also incorporate the high-frequency voltage variation shown in FIG. 2B. One approach is to model the overall profile shape as described previously, and also describe the parameters of an additional high-frequency signal (such as magnitude and frequency, a range for magnitude and frequency, or a standard deviation in voltage readings) for a specific profile region.

Figure 3:
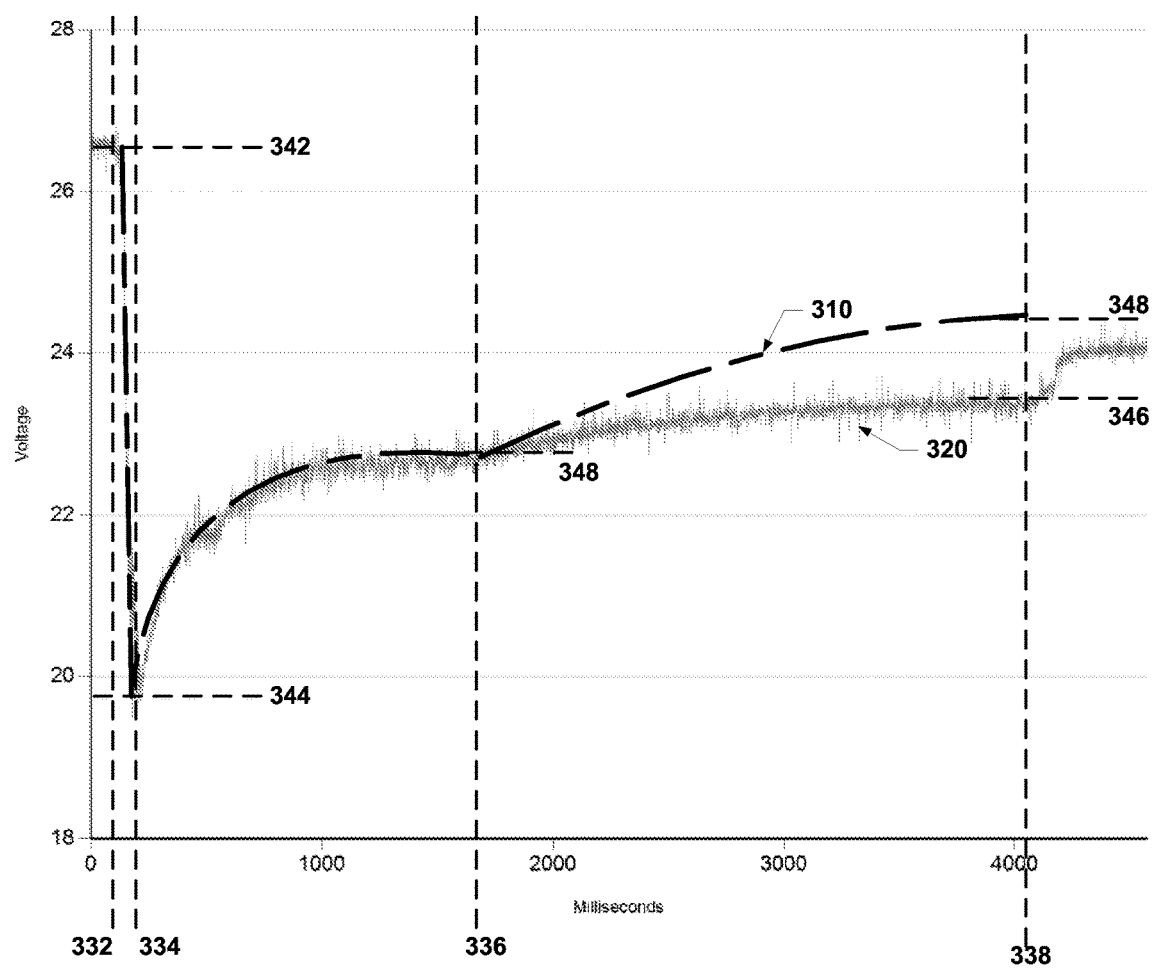
FIG. 3 illustrates a comparison between an example of a battery voltage profile during the start of a generator and a reference battery profile.

Once a reference voltage profile has been defined, captured battery voltage profiles can be tracked over time and compared with a reference profile. FIG. 3 is a visual comparison of a reference voltage profile 310 against a captured battery voltage profile 320. As shown in the figure, reference profile 310 and captured profile 320 exhibit similar features between times 332 and 336, but then diverge in shape between times 336 and 338.

To assist in this comparison, regions of a captured battery voltage profile may be determined by detecting a change in the slope of the battery profile voltage measurements over time. A variety of known methods may be applied to detecting this change of slope, and may be applied directly to the captured measurements, to a smoothed representation of the battery voltage profile, or to a mathematical equation representing the battery voltage profile which is defined based on the captured measurements. As an example, the measurements may be smoothed by applying the digital equivalent of a low-pass filter to the data, or by averaging the set of data within a moving window. Once smoothed, changes in slope may be detected by any one of a number of techniques, including taking the derivative of the smoothed battery voltage profile and looking for changes that exceed some predetermined threshold. For example, if a portion of the voltage profile exhibited a smoothed voltage curve for a set number of data points, for example 10, 50, or 100 points or more that differed by more than one or more standard deviations in slope for a previous portion of the voltage profile including 10, 50, or 100 data points, the portion of the voltage profile could be considered to belong to a different region than the previous portion. In other embodiments, regions of a captured battery voltage profile may be determined by dividing the captured battery voltage profile into regions having durations corresponding to durations of corresponding regions of a reference battery voltage profile. Any of various mathematical techniques known in the art may be utilized to define the different regions in a voltage profile.

In one implementation, the reference voltage profile is defined in terms of an expected magnitude of voltage change and duration for each profile region, and is compared against the corresponding regions of a captured battery voltage profile. By way of example, reference voltage profile 310 in FIG. 3 may be defined in terms of magnitude of the voltage change between voltages 342 and 344 and time duration time 334—time 332 in the engagement region of the profile. A smoothed representation of battery voltage profile 320 has a similar magnitude of voltage change and time duration in this profile region, and a comparison would indicate no significant difference between smoothed battery voltage profile 320 and reference profile 310 in this region (or in the cranking region from time 334 to time 336). A comparison of profile voltage change magnitudes and durations in the generator starting region between times 336 and 338, however, would highlight a significant difference in voltage levels between the reference profile 310 and smoothed battery voltage profile 320, even while the time duration in this region of the two profiles is similar.

In another implementation, the reference voltage profile is modeled as a collection of equations, providing a more comprehensive comparison against a captured battery voltage profile. Continuing with the example illustrated by FIG. 3, the reference voltage profile 310 is modeled as three equations, with one equation for each time duration shown (the time durations between times 332 and 334, between times 334 and 336, and between times 336 and 338, these time durations corresponding to the engagement, cranking, and generator starting regions, respectively). Between times 332 and 334, the reference profile is modeled as a straight line, and between times 334 and 336 (as well as between times 336 and 338) the reference profile is modeled as a curve. Each equation may be defined in terms of time passed since some reference time, where the reference time may be the start of the provision of power to the generator starter (time 332 in FIG. 3) or the beginning of the profile region for which the equation is defined. Each measurement of the smoothed battery voltage profile can be compared against the reference profile equation result for the same point in time. Alternately, one or more sample measurements of the smoothed battery voltage profile can be compared against the reference profile equation result at a corresponding point in time. As can be seen in FIG. 3, although the smoothed battery voltage profile and reference profile have similar voltage levels between times 332 and 336, the voltage levels diverge between times 336 and 338.

When comparing a smoothed battery voltage profile against a reference voltage profile, an acceptable range of deviation may be defined to minimize false positive alerts of poor generator battery health. If smoothed battery voltage profile parameters are within this acceptable range of deviation of the reference voltage profile parameters, no alert is generated. If the reference voltage profile is defined in terms of an expected magnitude of voltage change and duration for each profile region, for example, the acceptable range of deviation can be defined in terms of an absolute or percentage range around these parameters. If the reference voltage profile is modeled as a collection of equations, the acceptable range of deviation may also simply be an absolute or percentage range around the values generated by these equations.

In some embodiments battery health may be monitored by comparing the average voltage for the reference profile and test profile over the same time duration. A limit for a difference in the average voltage values could be established, for example, by empirical observation or experimentation. A difference in the average voltage in the defined portion of the reference profile and test profile above this established limit would be result in the battery being considered suspect and possibly in need of replacement.

In some embodiments a predetermined number of data points, for example, between about 10 points and 20 points or more, may be taken of the observed voltage at different times within a region of an observed voltage profile and compared to the voltages at corresponding points in time in a reference voltage profile. A sum of the differences between the observed and reference profile voltages may be computed and compared to a predefined non-zero positive limit, for example, a limit of between about 10 volts and about 20 volts for a 10 sample comparison or a limit of between about 20 volts and about 50 volts for a 20 sample comparison or a limit of between about 100 volts and about 300 volts, for example, about 200 volts for a comparison of one or more regions of a captured voltage profile to a reference profile (see Examples below). If the sum exceeds the predefined limit a warning may be issued to an operator by a control or monitoring system associated with the generator and/or battery. Limits for the sum may vary depending on the type of battery and may be experimentally determined and set at a proper level for a particular type of battery and for a particular portion and/or length of the battery voltage profile which is to be compared against a reference voltage profile for the battery.

Additionally or alternatively, the standard deviation of the differences between the observed and reference profile voltages may be calculated and compared to a predefined limit, for example, to a limit defined by two standard deviations of the voltage of the reference profile in the region analyzed. If the calculated standard deviation exceeds the predefined limit a warning may be issued to an operator by a control or monitoring system associated with the generator and/or battery.

In some embodiments, the acceptable range of deviation may be defined as a pair of equations around each equation of a profile region, with one of the pair of equations defining an upper bound around the reference voltage profile equation and the other of the pair of equations defining a lower bound. The equations around each equation of a profile region may be defined using known statistical process control techniques. For example, a standard deviation of voltage readings in each of the profile regions of the reference profile may be calculated and equations corresponding to one, two, and three standard deviations above and/or below the voltage values defined by the reference profile equations may be generated.

In some embodiments, control charts for voltage readings in the different profile regions may be established and data points for measured voltages plotted on these control charts. If the plotted data points violated one or more statistical process control (SPC) rules, this would be indicative of a potentially "tired" battery that could be approaching the end of its useful life and/or a problem with the generator system. A violation of the SPC rules could also be indicative of a problem with electrical connections, in the electrical system for generator starting (battery, cables, contactor, starter, etc). A control or monitoring system associated with the battery and/or generator could issue a warning responsive to the violation of the one or more SPC rule.

In some embodiments, control charts could be established and plotted data points monitored for violations of one or more of the Western Electric SPC rules. These rules are as follows:

1) One Point Outside Upper or Lower Control Limits

The Upper and Lower Control Limits are set at three standard deviations from the reference profile value at a particular point in time. If a point lies outside either of these limits, there is only a 0.3% chance that this was caused by the normal process.

2) Eight Points on the Same Side of the Reference Profile Value

There is an equal chance that any given point will fall above or below the reference profile value at a particular point in time. The chance that a point falls on the same side of the reference profile value as the one before it is one in two. The odds that the next point will also fall on the same side of the reference profile value is one in four. The probability of getting eight points in a row on the same side of the reference profile value is only around 1%.

3) Eight Points Increasing or Decreasing

The same logic is used here as for "Eight Points on the Same Side of the Reference Profile Value." Sometimes this rule is changed to seven points rising or falling.

4) Two of Three Points Outside Warning Limits

The Warning Limits are usually set at two standard deviations (i.e. two sigma) from the reference profile value. The probability that any point will fall outside the warning limit is only 5%. The chances that two out of three points in a row fall outside the warning limit is only about 1%.

5) Four of Five Points Falling Outside One Sigma

In normal processing, 68% of points fall within one sigma of the reference profile value, and 32% fall outside it. The probability that 4 of 5 points fall outside of one sigma is only about 3%.

6) Fourteen Points Alternating Direction

This rule treats each pair of adjacent points as one unit. The chances that the second point is always further away from the reference profile value (or always closer than) the preceding point, for all seven pairs, is only about 1%.

7) Fifteen Points in a Row within One Sigma

In normal operation, 68% of points will fall within one sigma of the reference profile value. The probability that 15 points in a row will do so is less than 1%.

8) Eight Points in a Row Outside One Sigma

Since 68% of points lie within one sigma of the reference profile value, the probability that eight points in a row fall outside of the one-sigma line is less than 1%.

In other embodiments, control charts could be utilized in which violations of one or more of the Wheeler or Nelson SPC rules (which would be known to those familiar with statistical process control) could be used as an indicator of a potentially defective battery and/or generator system.

For the acceptable range of deviation approaches described above, one or more additional parameters may be used to define the extent to which a smoothed battery voltage profile may deviate from a reference voltage profile before an excursion is noted or a warning is issued. As an example, one parameter may define the number of profile regions in which a battery voltage profile measurement is outside of an acceptable range of deviation. The captured battery voltage profile as a whole may be considered to be outside of an acceptable range of deviation only if it is outside of an acceptable range of deviation for the number of profile regions specified. In another example, a parameter may define a maximum time duration over which a captured battery voltage profile (or a smoother version of same) may exceed the acceptable range of deviation bounds around a reference voltage profile modeled by equations. Any excursion of battery voltage profile measurements outside of these bounds is not noted unless they remain outside of the bounds for at least this maximum time duration. This maximum time duration is in some embodiments about 10% of the total duration of a region in which the excursion occurs, and in other embodiments is about 25%, about 33%, about 50%, about 66%, or about 75% of the total duration of the region in which the excursion occurs.

Assuming a generator appears to the generator starting system (i.e. the battery and starter motor) with a repeatable load profile from one generator starting event to another, the battery voltage profile for a healthy battery should be consistent in its shape over each generator start. In addition to the generator load, other environmental factors, such as ambient temperature, can affect the battery voltage profile shape. The influence of such environmental factors can be accounted for by managing a set of reference voltage profiles, with each profile corresponding to a particular value (or range of values) of an environmental factor. As an example, a reference voltage profile may be defined in terms of magnitude and duration for each profile region, and a set of such reference profiles may be defined, with the parameter values of each reference profile corresponding to a range of ambient temperature values. In another example, a reference voltage profile may be modeled as a collection of equations, and a set of such reference profile models may be defined, with each profile model corresponding to a range of ambient temperature values. The reference profile or profile model against which a captured battery voltage profile is compared may be selected based on the level of the environmental factor, for example, the ambient temperature. Alternately, an environmental factor such as ambient temperature may be incorporated directly into the equations defining the reference voltage profile model.

The battery health monitoring approach described above can be extended in several ways to monitor additional components within the electrical system responsible for providing electrical power to the generator. In addition to the battery voltage profile during generator start, the steady-state battery voltage over time could be monitored. This steady-state battery voltage will vary slightly over time as the battery is trickle charged in advance of a generator start, and will vary when being recharged after a generator start. Reference profiles for the steady-state battery voltage can be developed in a fashion similar to the reference voltage profiles described above for battery voltage during generator start. Also, environmental factors can impact steady-state battery voltage just as they can impact the battery voltage profile during generator start, and these factors can be accounted for in one or more steady-state reference profiles using methods similar to those described above for the reference voltage profile for a generator start. Monitoring steady state battery voltage could also provide indications of problems with the trickle charger, and/or suggest modifications to the trickle charging scheme to prolong battery life.

Monitoring the voltage at different points in the electrical system providing electrical power to the generator can provide additional information about the health of components in this electrical system. As an example, consider a monitoring configuration in which voltage is measured at both the battery terminals and starter motor terminals. Knowledge of the resistance of the cables connecting the battery to the starter motor, along with the difference in voltage measured at the battery and starter, can be combined to estimate the current flowing through the cables. Environmental factor measurements (such as battery temperature) could be included with these voltage measurements and derived estimation of current to build a model of the battery/cables/starter motor system. Future measurements can then be compared against expected values from this model as a means of tracking the health of the components within this system.

The battery health monitoring approach described above can also be extended to encompass multiple generator installations (either at one physical location or at multiple physical locations). Data captured from different battery and generator models and sizes, and different battery/generator combinations, can be used to create and refine reference voltage profiles and acceptable range of deviation definitions. If environmental factors such as ambient temperature affect the battery voltage profile during generator start, measurements of such environmental factors can be captured as well. As an example, consider a generator monitoring service which collects the measurements described above and provides generator owners with reports and alerts concerning the health of generator batteries. The generator monitoring service may track a variety of specification data for each generator and battery, including manufacturer, model, size, and nominal output ratings. The generator monitoring service may combine data collected from several generator installations with similar features (such as the same manufacturer or model, or the same nominal output ratings) to generate reference voltage profiles and acceptable range of deviation definitions that can be applied to generator installations with these similar features.

EXAMPLES

FIGS. 5A-6C illustrate comparisons made between two different batteries and reference profiles for the batteries during generator start events and how a determination may be made as to whether the batteries tested exhibited abnormal profiles differing from the corresponding reference profile to a degree which would render them suspect and possibly in need of replacement.

Figure 5A:
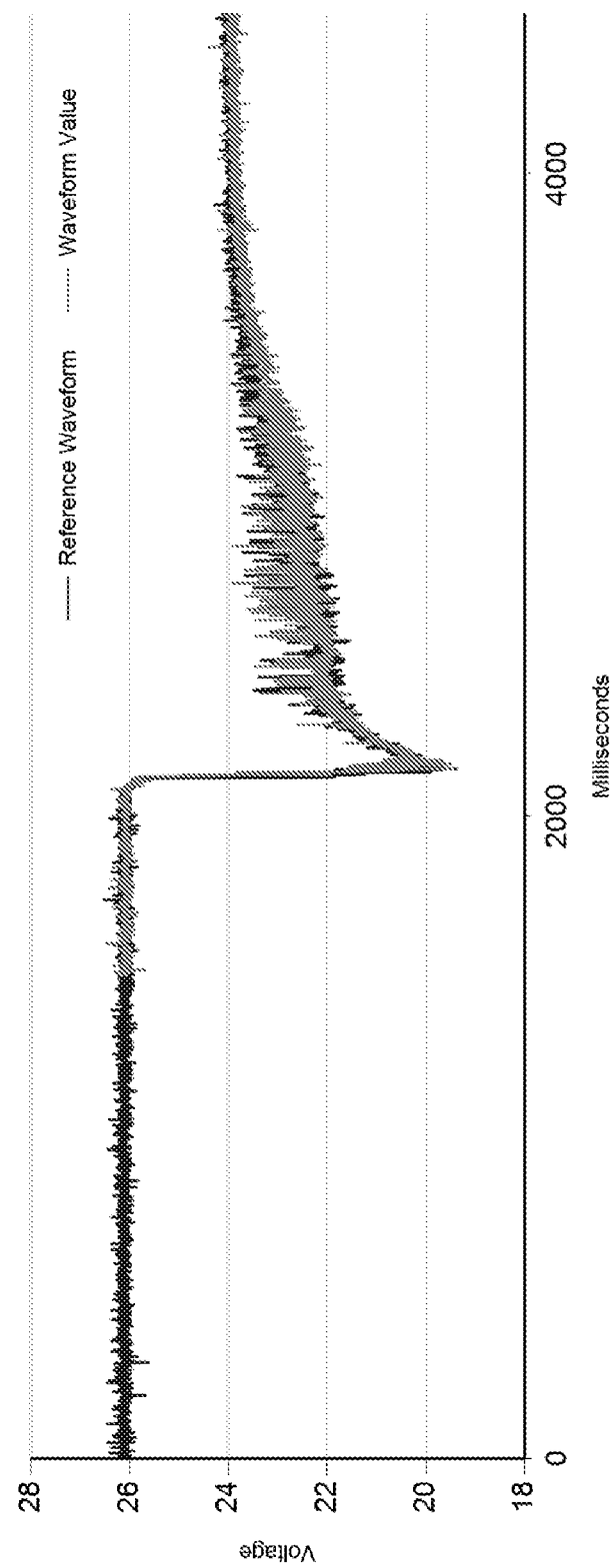
FIG. 5A is an example of a third battery voltage profile during the start of a generator superimposed on a reference voltage profile for a third battery.

FIG. 5A illustrates a captured voltage profile for a battery during a generator start event superimposed on a reference profile, which had been previously created for the battery.

Figure 5B:
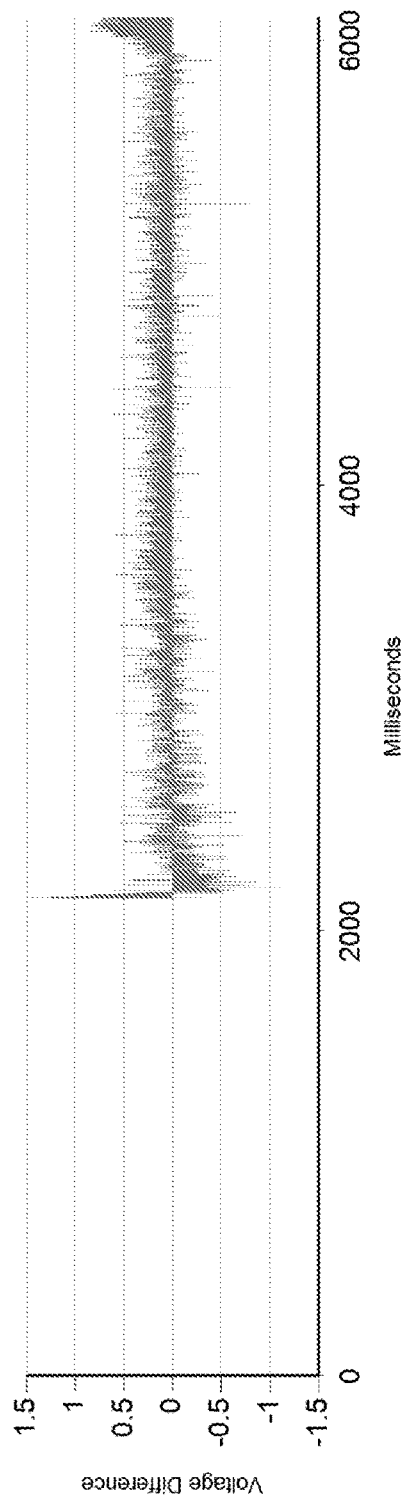
FIG. 5B illustrates calculated differences in value between voltage readings in the third battery voltage profile and corresponding voltage values in the reference voltage profile for the third battery.

As illustrated in FIG. 5B, the differences between voltage data points in the captured and reference profiles were compared for regions of the voltage profiles after the end of the engagement region at the time just after 2,000 milliseconds from the beginning of the reference voltage profile until a point in time at just after about 6,000 milliseconds from the beginning of the reference voltage profile. A voltage data point in the reference profile exceeding that of a corresponding voltage data point in the captured profile is represented as a positive deviation. FIG. 5B illustrates that the captured battery profile voltage data points were generally lower than corresponding battery profile voltage data points in the reference profile.

Figure 5C:
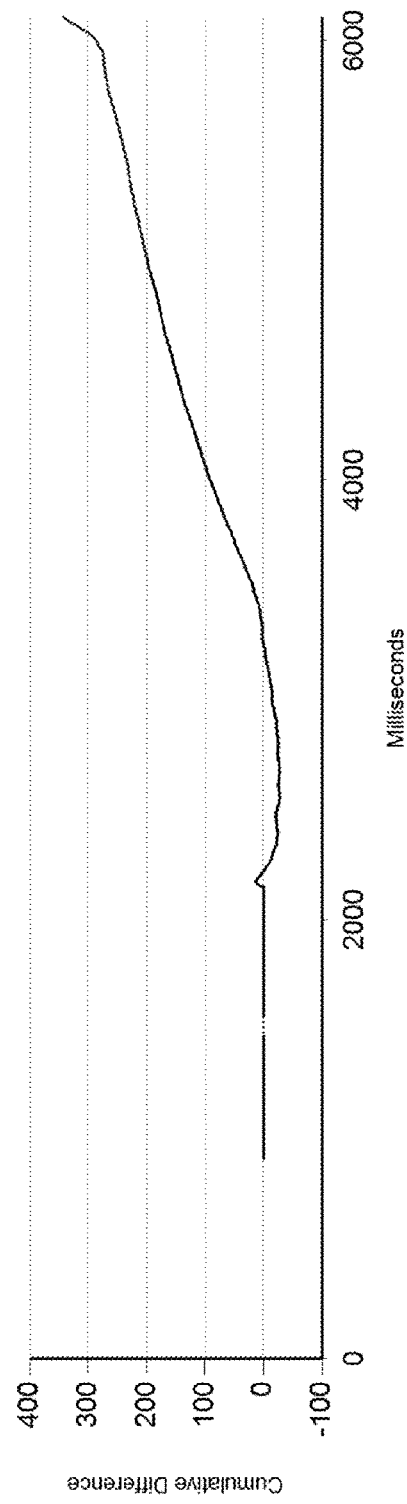
FIG. 5C illustrates a cumulative sum of the calculated differences illustrated in FIG. 5B.

FIG. 5C illustrates a cumulative sum over time of the voltage differences illustrated in FIG. 5B. The cumulative sum increased with time. A threshold of 200 volts was experimentally set for a cumulative deviation in voltage data points between the reference voltage profile and the captured voltage profile indicative of a battery that might need to be replaced. FIG. 5C illustrates that the cumulative sum of the voltage deviations for the battery tested exceeded this limit at a point in time at about 4,000 milliseconds from the beginning of the reference voltage profile. The comparison illustrated in FIGS. 5A-5C thus indicated that the battery in question should be considered suspect and possibly in need of replacement. Separate testing of the battery, however, revealed it to be healthy, which indicates that a cumulative voltage deviation of 200 volts may have been too low for this particular type of battery.

Figure 6A:
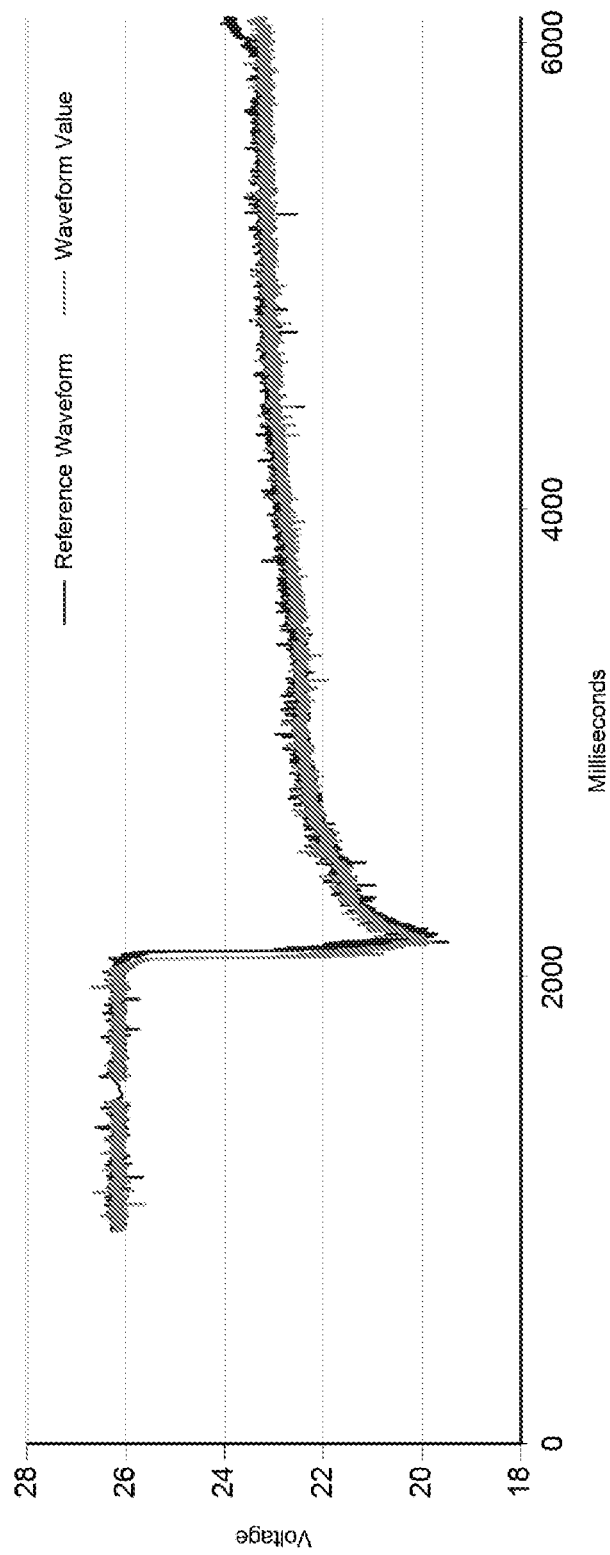
FIG. 6A is an example of a fourth battery voltage profile during the start of a generator superimposed on a reference voltage profile for a fourth battery.

FIG. 6A illustrates a captured voltage profile for a second battery during a generator start event superimposed on a reference profile, which had been previously created for the battery. It can be observed that the reference battery profile for the second battery differed from that illustrated in FIG. 5A. The reference profile of FIG. 6A exhibited less variance in voltage and exhibited an upwardly trending "tail" just after the point in time indicated at 6,000 milliseconds. Without being bound to a particular theory, this "tail" may represent the beginning of the generator start region of the reference battery profile. The "tail" could also be indicative of the alternator (charging system driven by the generator) becoming active; and it could be indicative of the starter motor being disengaged from the battery.

Figure 6B:
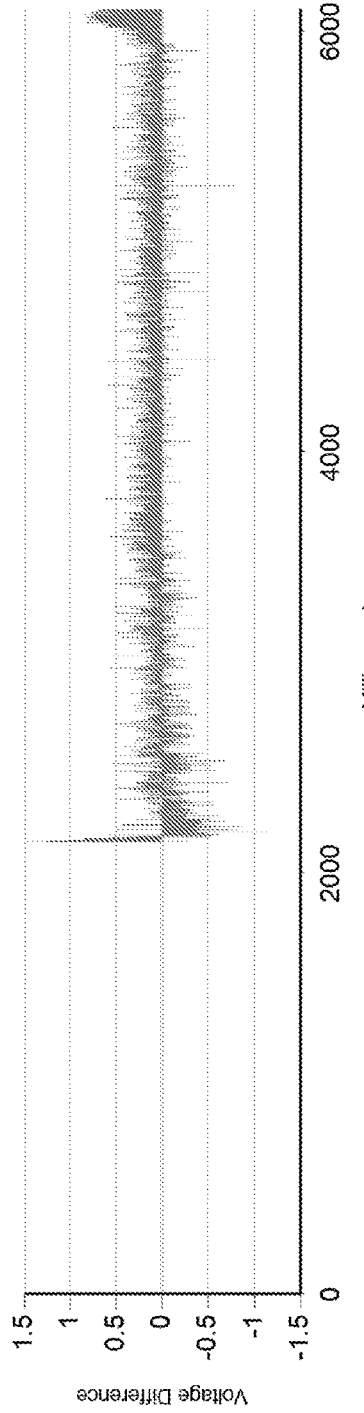
FIG. 6B illustrates calculated differences in value between voltage readings in the fourth battery voltage profile and corresponding voltage values in the reference voltage profile for the fourth battery.

FIG. 6B illustrates the observed differences between voltage data points in the captured and reference profiles for regions of the voltage profiles between the points in time just after the 2,000 millisecond indicator to just after the 6,000 millisecond indicator. As in FIG. 5B, voltage data point in the reference profile exceeding that of a corresponding voltage data point in the captured profile is represented as a positive deviation. FIG. 6B illustrates that the captured battery profile voltage data points were at first generally higher than the corresponding battery profile voltage data points in the reference profile (in the time period just after the 2,000 millisecond mark to a time just after about 3,000 milliseconds) and then shifted to being lower than corresponding battery profile voltage data points in the reference profile.

Figure 6C:
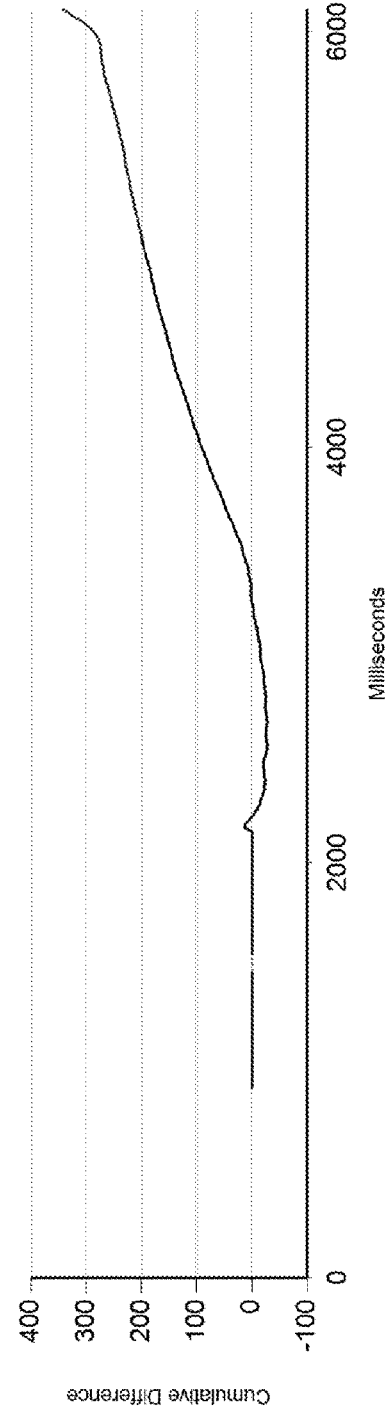
FIG. 6C illustrates a cumulative sum of the calculated differences illustrated in FIG. 6B.

FIG. 6C illustrates a cumulative sum over time of the voltage differences illustrated in FIG. 6B. The cumulative sum increased with time. A threshold of 200 volts was experimentally set for a cumulative deviation in voltage data points between the reference voltage profile and the captured voltage profile indicative of a battery that might need to be replaced. FIG. 6C illustrates that the cumulative sum of the voltage deviations for the battery tested exceeded this limit at a point in time at about 5,000 milliseconds. The comparison illustrated in FIGS. 6A-6C thus indicated that the battery in question should be considered suspect and possibly in need of replacement. Separate testing of the battery, however, revealed it to be healthy, which indicates that a cumulative voltage deviation of 200 volts may have been too low for this particular type of battery.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A system for determining the state of health of a generator battery and the ability of the battery to supply a generator starter motor with start-up energy, the system comprising:
    a generator having a starter motor and electrical outputs;
    a battery electrically coupled to the starter motor of the generator; and
    a monitoring system including an electrical meter having a first plurality of terminals electrically connected to the electrical outputs of the generator for receiving signals from the electrical outputs of the generator and a terminal electrically connected to the battery for receiving a signal from the battery, the monitoring system being configured to:
        monitor electrical characteristics of power supplied from the electrical outputs of the generator using the first plurality of terminals of the electrical meter,
        capture a profile of voltage across terminals of the battery during a supply of electrical energy from the battery to the starter motor through the terminal of the electrical meter electrically connected to the battery,
        define one or more regions of a reference voltage profile, each of the one or more regions having a duration and a magnitude of voltage change,
        generate one or more mathematical equations describing the reference voltage profile in the one or more regions,
        define statistical process control limits about the one or more mathematical equations,
        compare the captured voltage profile to the reference voltage profile and determine if a difference between the captured voltage profile and reference voltage profile exceeds an acceptable amount, and
        issue a warning responsive to data points in the captured battery profile violating a statistical process control rule relative to the statistical process control limits.

2. The system of claim 1, further including an output configured to issue a warning responsive to the difference between the captured voltage profile and the reference voltage profile exceeding the acceptable amount.

3. The system of claim 1, wherein the monitoring system further includes a controller configured to provide a signal to the generator to start and to provide a signal to the electrical meter to begin measuring the voltage profile.

4. The system of clam 1, wherein the controller is further configured to cause the electrical meter to begin to capture the voltage profile with a pre-trigger capture delay prior to the beginning of a generator starting operation.

5. The system of claim 1, wherein the controller is further configured to generate a visual representation of the captured voltage profile compared to the reference voltage profile.

6. The system of claim 1, wherein the monitoring system is configured to generate the reference voltage profile from a previously captured battery voltage profile.

7. The system of claim 6, wherein the monitoring system is configured to generate the reference voltage profile from an aggregation of a plurality of previously captured battery voltage profiles.

8. The system of claim 7, wherein the monitoring system is configured to generate the reference voltage profile from an aggregation of a plurality of previously captured battery voltage profiles captured from over a moving window of time during which a predefined number of generator start operations were performed.

9. The system of claim 1, wherein the monitoring system is further configured to build a mathematical model describing the reference voltage profile in the one or more regions and issue a warning responsive to the captured battery voltage profile differing from the mathematical model in corresponding one or more of the one or more regions by more than a predetermined amount.

10. The system of claim 1, wherein the monitoring system is further configured to compare one of a duration and a voltage change magnitude of at least one region of the captured voltage profile to that of a corresponding at least one region of the reference voltage profile and issue a warning responsive to a difference between the one of the duration and the voltage change magnitude of the at least one region of the captured voltage profile and that of a corresponding region of the reference voltage profile exceeding a predefined amount.

11. A method of determining the state of health of a generator battery and the ability of the battery to supply a generator starter motor with start-up energy, the method comprising:

building a reference voltage profile for generator starts;
defining one or more regions of the reference voltage profile, each of the one or more regions having a duration and a magnitude of voltage change,
generating one or more mathematical equations describing the reference voltage profile in the one or more regions,
defining statistical process control limits about the one or more mathematical equations,
monitoring characteristics of electrical power supplied by electrical outlets of the generator with an electrical meter using a first plurality of terminals of the electrical meter electrically connected to the electrical outlets of the generator;
capturing a battery voltage profile during a generator start operation with the electrical meter through a terminal of the electrical meter electrically connected to the battery;
comparing the captured battery voltage profile to the reference voltage profile; and
issuing a warning responsive to data points in the captured battery profile violating a statistical process control rule relative to the statistical process control limits.

12. The method of claim 11, further comprising issuing a warning responsive to a cumulative sum of values of differences between a plurality of measurements of the voltage of the captured battery profile and the voltage of the reference voltage profile at corresponding periods of time exceeding a predefined limit.

13. The method of claim 11, wherein capturing the battery voltage profile comprises defining one or more regions in the captured battery voltage profile corresponding to the one or more regions defined in the reference voltage profile.

14. The method of claim 13, further comprising issuing a warning responsive to a standard deviation of a plurality of measurements of the voltage in one or more of the regions of the captured battery voltage profile exceeding a standard deviation of voltage in the reference voltage profile in corresponding one or more regions by more than a predefined amount.

15. The method of claim 13, further comprising issuing a warning responsive to one or more parameters of at least two of the regions of the captured voltage profile differing from one or more parameters of corresponding regions of the reference voltage profile by more than predetermined amounts.

16. The method of claim 13, further comprising issuing a warning responsive to one or more parameters of a region of the captured voltage profile differing from one or more parameters of a corresponding region of the reference voltage profile by more than predetermined amount for more than a predetermined amount of time.

17. The method of any claim 11, further comprising generating a plurality of reference voltage profiles corresponding to different levels of an environmental factor and comparing the captured voltage profile to a reference voltage profile selected from the plurality of voltage reference profiles responsive to a level of the environmental factor.

18. The method of claim 11, further comprising monitoring a steady-state voltage profile of the battery during a time other than during the generator start operation and issuing a warning responsive to the monitored steady-state voltage profile differing from a reference steady-state voltage profile by greater than a predefined amount.

* * * * *